United States Patent [19]

Egawa et al.

[11] Patent Number: 4,883,986

[45] Date of Patent: Nov. 28, 1989

[54] HIGH DENSITY SEMICONDUCTOR CIRCUIT USING CMOS TRANSISTORS

[75] Inventors: Hideharu Egawa, Tokyo; Yasoji Suzuki, Yokosuka, both of Japan

[73] Assignee: Tokyo Shibaura Denki Kabushiki Kaisha, Kawasaki, Japan

[21] Appl. No.: 378,266

[22] Filed: May 14, 1982

[30] Foreign Application Priority Data

May 19, 1981 [JP] Japan .................................. 56-75164
May 19, 1981 [JP] Japan .................................. 56-75176

[51] Int. Cl.⁴ ..................... H01L 27/02; H01L 29/78; H01L 27/12; H03K 19/094
[52] U.S. Cl. .............................. 307/298; 307/482.1; 307/451; 307/585; 307/303.2; 357/42; 357/23.7
[58] Field of Search ............................... 307/449–452, 307/481, 482, 585, 571, 579, 475, 530, 362, 355, 240, 298; 365/181; 357/23.7, 42

[56] References Cited

U.S. PATENT DOCUMENTS

| | | | |
|---|---|---|---|
| 3,551,693 | 12/1970 | Burns et al. | 307/481 |
| 3,737,673 | 6/1973 | Suzuki | 307/452 |
| 4,053,916 | 10/1977 | Cricchi et al. | 357/23.7 |
| 4,185,209 | 1/1980 | Street | 307/451 X |
| 4,199,384 | 4/1980 | Hsu | 357/23.7 X |
| 4,199,773 | 4/1980 | Goodman et al. | 357/23.7 |
| 4,231,055 | 10/1980 | Iizuka | 357/42 |
| 4,237,390 | 12/1980 | Buurma | 307/362 |
| 4,242,156 | 12/1980 | Peel | 357/23.7 X |
| 4,381,460 | 4/1983 | Menachem | 307/482 X |
| 4,461,965 | 7/1984 | Chin | 307/530 |
| 4,484,209 | 11/1984 | Uchida | 357/23.7 |
| 4,491,856 | 1/1985 | Egawa et al. | 357/23.7 X |
| 4,547,790 | 10/1985 | Egawa | 357/23.7 X |

FOREIGN PATENT DOCUMENTS

| | | | |
|---|---|---|---|
| 66971 | 12/1981 | Japan | 357/23.7 |
| 52874 | 3/1983 | Japan | 357/23.7 |

OTHER PUBLICATIONS

Fink et al., *Electronics Engineer's Handbook*, McGraw-Hill, Inc., pp. 16-15–16-19, 1975.
Evans, *Designing with FETs*, McGraw-Hill, Inc., pp. 83–89, 1981.
Bingham, "CMOS: Higher Speeds, More Drive and Analog Capability Expand Its Horizons", Electronic Design 23, pp. 74–84, 11-8-1978.

*Primary Examiner*—Stanley D. Miller
*Assistant Examiner*—David R. Bertelson
*Attorney, Agent, or Firm*—Finnegan, Henderson, Farabow, Garrett and Dunner

[57] ABSTRACT

A semiconductor circuit has a power source terminal set at a positive potential, a reference potential terminal set at a reference potential, a first MOS transistor whose current path is connected between the power source terminal and an output terminal, and a second MOS transistor whose current path is connected between the output terminal and the reference potential terminal. The gates of the first and second MOS transistors are commonly connected to an input terminal. The first and second MOS transistors are respectively n- and p-channel MOS transistors.

13 Claims, 9 Drawing Sheets

F I G. 10A 
F I G. 10B 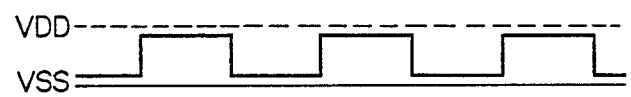
F I G. 11 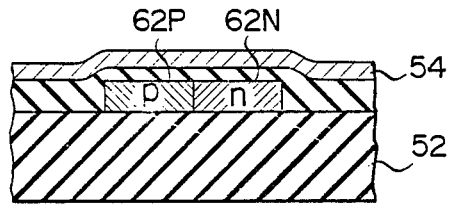
F I G. 12A 
F I G. 12B 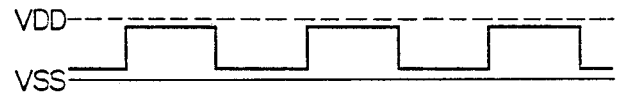
F I G. 13 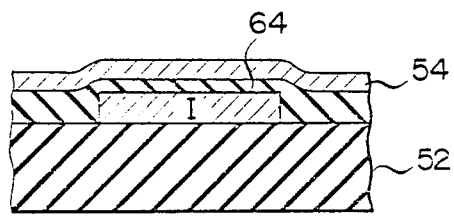
F I G. 14A 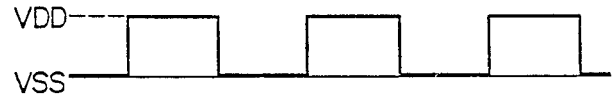
F I G. 14B 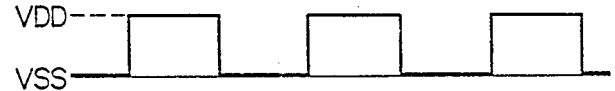

HIGH DENSITY SEMICONDUCTOR CIRCUIT USING CMOS TRANSISTORS

BACKGROUND OF THE INVENTION

The present invention relates to a semiconductor circuit having p- and n-channel MOS transistors.

A semiconductor device of the so-called silicon-on-sapphire (SOS) structure is known which has semiconductor elements formed on an insulating substrate so as to improve the integration density of the MOS integrated circuit and to improve circuit characteristics. An SOS semiconductor device thus uses an insulating substrate. Therefore, as compared with a semiconductor device using a general semiconductor substrate, the stray capacitance is smaller and the frequency characteristics are improved. Furthermore, since the elements can be easily insulated with smaller isolation spaces, high integration may be easily attained.

FIGS. 1 and 2 are respectively a circuit diagram of a CMOS inverter and a schematic plan view of an SOS semiconductor device constituting this CMOS inverter. This CMOS inverter has p- and n-channel MOS transistors TP1 and TN1 of depletion-type (D-type), the gates of which are coupled to an input terminal VI, the drains of which are respectively connected to a positive power source terminal VD and a ground terminal VS, and the sources of which are connected to an output terminal VO. These MOS transistors TP1 and TN1 include as shown in FIG. 2, p- and n-type semiconductor layers 10P and 10N formed on a sapphire substrate 12, and a gate electrode layer 14 formed crosswise over the semiconductor layers 10P and 10N as insulated therefrom. Adjacent first ends of the semiconductor layers 10P and 10N are both connected to an interconnection layer 16 for the output line. The other end of the p-type semiconductor layer 10P is connected to an interconnection layer 18 for the positive power source line. The other end of the n-type semiconductor layer 10N is connected to an interconnection layer 20 for the ground line. Of course, in this case a sufficiently thick insulation layer (not shown) is formed between overlapped portions of the interconnection layer 18 and the n-type layer 10N, and no active transistor is formed in a corresponding area (which is hatched in FIG. 2).

As shown in FIG. 2, in order to electrically insulate the p- and n-type layers 10P and 10N from each other, they need only be formed with a small gap therebetween. Therefore, the occupying area of the CMOS inverter may be made very small.

FIGS. 3 and 4 are respectively a circuit diagram of a CMOS NOR gate circuit and a schematic plan view of an SOS semiconductor device constituting the CMOS NOR gate. The CMOS NOR gate circuit has D-type p-channel MOS transistors TP2 and TP3 whose current paths are serially connected between the power source terminal VD and the output terminal, and D-type n-channel MOS transistors TN2 and TN3 whose current paths are each connected between the output terminal VO and the power source terminal VS. As shown in FIG. 4, the p-channel MOS transistors TP2 and TP3 includes a p-type semiconductor layer 30 formed on a sapphire substrate 32, and gate electrode layers 34 and 36 which are formed crosswise over the p-type semiconductor layer 30 as insulated therefrom. Similarly, the n-channel MOS transistor TN2 includes an n-type semiconductor layer 38 formed on the sapphire substrate 32, and the gate electrode layer 34. The n-channel MOS transistor TN3 includes an n-type semiconductor layer 40 formed on the sapphire substrate 32 and the gate electrode layer 36. An insulating layer (not shown) between the gate electrode layer 34 and the n-type semiconductor layer 40 and an insulating layer (not shown) between the gate electrode layer 36 and the n-type semiconductor layer 38 are formed sufficiently thick. The transistors are not formed at the crossing regions (hatched parts) of these layers.

One end of each of the p- and n-type semiconductor layers 30, 38 and 40 are connected to an interconnection layer 42 for the output line. The other end of the p-type semiconductor layer 30 is connected to an interconnection layer 44 for the positive power source line. The other ends of the n-type semiconductor layers 38 and 40 are both connected to an interconnection layer 46 for the ground line.

In the NOR gate circuit device shown in FIG. 4, if the p- and n-type semiconductor layers 30, 38 and 40 are formed with slight distances therebetween, they may be electrically insulated from each other. Therefore, the occupying area of the NOR gate circuit device may be reduced.

However, in the semiconductor circuit shown in FIGS. 1 and 3, the p-channel MOS transistor is connected to the positive power source terminal VD which is set at a high potential, and the n-channel MOS transistor is connected to the ground terminal VS which is set at a low potential. Therefore, if the p- and n-type semiconductor layers for these p- and n-channel MOS transistors are formed in contact with each other, the operating voltage of the circuit is limited. More specifically, when the p- and n-type semiconductor layers are formed in contact with each other, if an operating voltage higher than the forward contact potential difference at the pn junction is applied between the positive power source terminal VD and the ground terminal VS, a forward current flows through, the pn junction. For this reason, the operating voltage must be set to be lower than the forward contact potential difference at the pn junction.

SUMMARY OF THE INVENTION

It is an object of the present invention to provide a semiconductor circuit which has p- and n-channel MOS transistors with p- and n-type semiconductor layers which can be formed in contact with each other.

This object may be achieved by a semiconductor circuit which has an n-channel MOS transistor circuit connected between a circuit point and a first power source terminal set at a predetermined potential, and a p-channel MOS transistor circuit connected between the circuit point and a second power source terminal set at a potential lower than the predetermined potential.

According to the present invention, the n-type semiconductor layer of the n-channel MOS transistor circuit is set at a potential higher than the potential of the p-type semiconductor layer of the p-channel MOS transistor. Therefore, these p- and n-type semiconductor layers can be formed in contact with each other, so that a semiconductor circuit of high integration may be manufactured.

BRIEF DESCRIPTION OF THE DRAWINGS

FIGS. 10A and 10B show signal waveforms for explaining the mode of operation of the buffer circuit shown in FIG. 5, which includes the D-type MOS transistor as shown in FIG. 7;

FIG. 11 is a sectional view of a semiconductor device of E-type in the same manner as in FIG. 7;

FIGS. 12A and 12B show signal waveforms for explaining the mode of operation of the buffer circuit shown in FIG. 5, which includes the E-type MOS transistor as shown in FIG. 11;

FIG. 13 is a sectional view of a semiconductor device of I-type in the same manner as in FIG. 7;

FIGS. 14A and 14B show signal waveforms for explaining the mode of operation of the buffer circuit shown in FIG. 5, which includes the I-type MOS transistor as shown in FIG. 13;

DETAILED DESCRIPTION OF THE PREFERRED EMBODIMENTS

Figure 5:
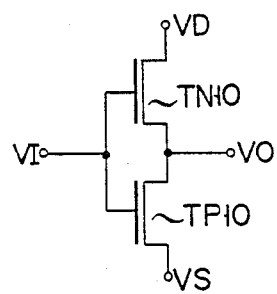
FIG. 5 is a circuit diagram of a buffer circuit according to an embodiment of the present invention.
Figure 6:
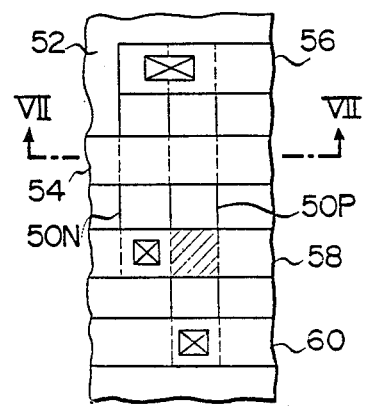
FIG. 6 is a schematic plan view of a semiconductor device constituting the buffer circuit shown in FIG. 5.

FIG. 5 shows a CMOS buffer circuit according to an embodiment of the present invention, and FIG. 6 is a schematic plan view of an SOS semiconductor device constituting this CMOS buffer circuit. This CMOS buffer circuit has n- and p-channel MOS transistors TN10 and TP10, the gates of which are both connected to the input terminal VI, the sources of which are both connected to the output terminal VO, and the drains of which are respectively connected to the positive power source terminal VD and the ground terminal VS. The MOS transistors TN10 and TP10 include, as shown in FIG. 6, n- and p-type semiconductor layers 50N and 50P formed on a sapphire substrate 52, and a gate electrode layer 54 which is formed crosswise over these semiconductor layers 50N and 50P, through an insulating layer (not shown). One end of each of the semiconductor layers 50N and 50P is connected to an interconnection layer 56 for the output line. The other end of the n-type semiconductor layer 50N is connected to an interconnection layer 58 for the positive power source line. The interconnection layer 58 is formed over the p-type semiconductor layer 50P through a sufficiently thick insulating layer (not shown) so that no active transistor may be formed in the hatched area shown in FIG. 6. The other end of the p-type semiconductor layer 50P is connected to an interconnection layer 60 for the ground line.

Figure 7:
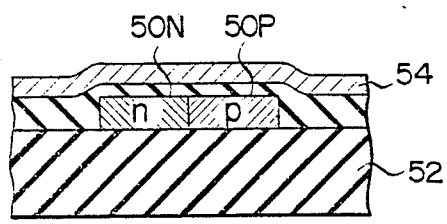
FIG. 7 is a sectional view of the semiconductor device shown in FIG. 6 along the line VII—VII therein.

FIG. 7 is an enlarged sectional view of the semiconductor device shown in FIG. 6 along the line VII—VII therein, wherein the MOS transistors TN10 and TP10 are of depletion-type (D-type). Referring to FIG. 7, the insulating layer (omitted in FIG. 6 for simplicity) is shown as formed over the sapphire substrate 52 and the layers 50N and 50P.

As shown in FIGS. 6 and 7, a positive power source voltage is applied to the n-type semiconductor layer 50N, while the p-type semiconductor layer 50P is kept at a ground potential. Therefore, even if the layers 50N and 50P are formed in contact with each other, a reverse bias voltage is applied between these layers 50N and 50P, so that the current will not flow through the pn junction between the layers 50N and 50P. In other words, although the n- and p-type semiconductor layers 50N and 50P are formed in contact with each other, they are insulated from each other in practical sense.

Figure 8:
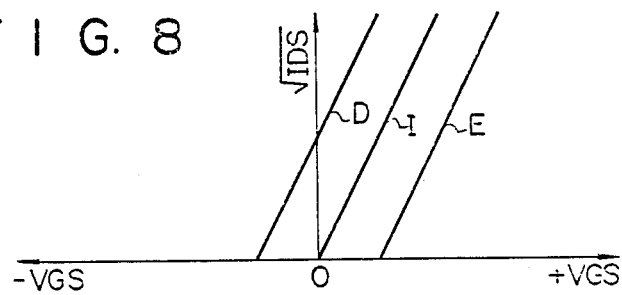
FIGS. 8 and 9 are respectively graphs showing the gate voltage-drain current characteristics of the nand p-channel MOS transistors shown in FIG. 5.
Figure 9:
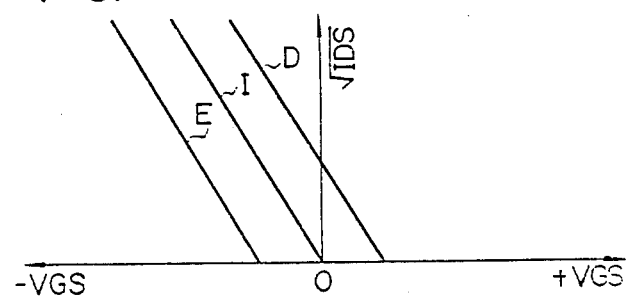

FIGS. 8 and 9 respectively show the gate voltage-drain current characteristics of the n- and p-channel MOS transistors. Referring to FIGS. 8 and 9, the gate-source voltage VGS of the MOS transistors is plotted as the abscissa, while the square root of drain current IDS is plotted as the ordinate. Lines D, E and I respectively show the gate voltage-drain current characteristics of a D-type MOS transistor, an E-type (enhancement-type) MOS transistor, and an I-type (intrinsic or zero-threshold type) MOS transistor.

The mode of operation of the CMOS buffer circuit shown in FIG. 6 will now be described with reference to the characteristic curves shown in FIGS. 8 and 9 and the signal waveforms shown in FIGS. 10A and 10B.

If the input voltage applied to the input terminal VI of this CMOS buffer circuit is at a VDD level or level "1" as shown in FIG. 10A, both the MOS transistors TN10 and TP10 are rendered conductive and a dc current flows between the power source terminals VD and VS. In this state, as may be seen from FIGS. 8 and 9, the ratio of the ON-state resistance of the MOS transistor TP10 to that of the MOS transistor TN10 is sufficiently great. Thus, an output signal of level "1" corresponding to this ON-state resistance ratio appears at the output terminal VO as shown in FIG. 10B. If the input voltage is at a VSS level (e.g., 0 V) or level "0", both the MOS transistors TN10 and TP10 are rendered conductive, and a dc current flows between the power source terminals VD and VS. In this state, the ratio of the ON-state resistance of the MOS transistor TP10 to that of the MOS transistor TN10 becomes smaller than that obtained when the input voltage of level "1" is applied to the input terminal VI. Thus, an output level of level "0" corresponding to this ON-state resistance ratio appears at the output terminal VO, as shown in FIG. 10B. Therefore, the conduction states of the MOS transistors TN10 and TP10 and the level of the output signal appearing at the output terminal VO change as shown in Table I below in accordance with changes in the level of the input signal applied to the input terminal VI.

TABLE I

| VI | TN10 | TP10 | VO |
|---|---|---|---|
| "1" | ON | ON | "1" |
| "0" | ON | ON | "0" |

A case will now be considered where the MOS transistors as shown in FIG. 5 are of E-type n- and p-channel MOS transistors. In this case, the cross section of the structure corresponding to that shown in FIG. 7 is shown in FIG. 11. The semiconductor layers 50N and 50P below the gate electrode layer 54 shown in FIG. 5 are respectively replaced by p- and n-type regions 62P and 62N.

The mode of operation of the CMOS buffer circuit having these E-type MOS transistors TN10 and TP10 will now be described with reference to FIGS. 12A and 12B.

If the input voltage applied to the input terminal VI is at a VDD level or level "1" as shown in FIG. 12A, the MOS transistor TN10 is set in the saturated state, and the MOS transistor TP10 is rendered nonconductive. As a result, an output voltage at a level (VDD−VEN) (where VEN is the threshold voltage of the E-type MOS transistor TN10) is obtained at the output terminal VO as a signal of level "1" as shown in FIG. 12B.

If the input voltage applied to the input terminal VI is at a VSS level or level 0", the MOS transistor TN10 is rendered nonconductive and the MOS transistor TP10 is set in the saturated state. As a result, an output voltage at a level (VSS+|VEP|) (where VEP is the threshold voltage of the E-type MOS transistor TP10) appears at the output terminal VO as shown in FIG. 12B. Therefore, the conduction states of the MOS transistors TN10 and TP10 and the level of the output signal appearing at the output terminal VO change as shown in Table II below in accordance with changes in the level of the input signal applied to the input terminal VI.

TABLE II

| VI | TN10 | TP10 | VO |
|---|---|---|---|
| "1" | ON | OFF | "1" |
| "0" | OFF | ON | "0" |

A case will now be considered where the MOS transistors TN10 and TP10 shown in FIG. 5 are formed as I-type n- and p-channel MOS transistors having a threshold voltage of about 0 V. In this case, the cross section of the circuit corresponding to that shown in FIG. 7 is shown in FIG. 13. Thus, the semiconductor layers 50N and 50P below the gate electrode layer 54 shown in FIG. 5 are replaced by an intrinsic semiconductor layer 64.

The mode of operation of the CMOS buffer circuit having these I-type MOS transistors TN10 and TP10 will be described with reference to FIGS. 14A and 14B.

If the input voltage applied to the input terminal VI is at a VDD level or level "1" as shown in FIG. 14A, the MOS transistor TN10 is set in the saturated state while the MOS transistor TP10 is rendered nonconductive. Thus, an output voltage of about VDD level or level "1" is generated from the output terminal VO as shown in FIG. 14B. On the other hand, if the input voltage applied to the input terminal VI is at a VSS level or level "0", the MOS transistor TN10 is rendered nonconductive while the MOS transistor TP10 is set in the saturated state. Thus, an output voltage of about VSS level or level "0" is generated from the output terminal VO. In this case, the conduction states of the MOS transistors TN10 and TP10 and the level of the output signal change as shown in Table II in accordance with changes in the level of the input signal applied to the input terminal VI.

Figure 15:
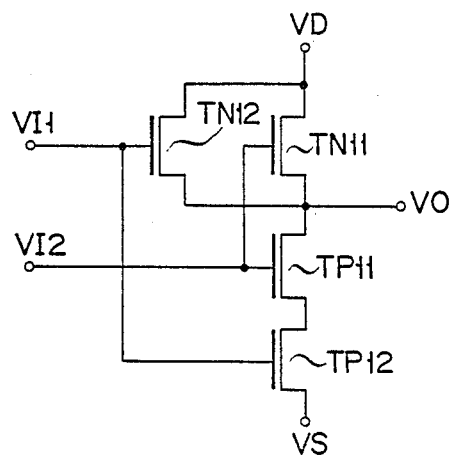
FIG. 15 is a circuit. diagram of a CMOS OR gate circuit according to another embodiment of the present invention.
Figure 16:
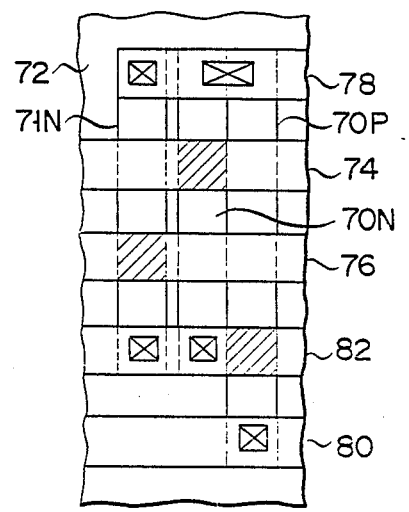
FIG. 16 is a schematic plan view of a semiconductor device constituting the CMOS OR gate circuit shown in FIG. 15.

FIG. 15 is a circuit diagram of a CMOS OR circuit according to still another embodiment of the present invention. FIG. 16 is a schematic plan view of an SOS semiconductor device constituting the CMOS OR circuit shown in FIG. 15. This CMOS OR circuit has n-channel MOS transistors TN11 and TN12 whose current paths are connected parallel to each other between the positive power source terminal VD and the output terminal VO, and p-channel MOS transistors TP11 and TP12 whose current paths are series-connected between the output terminal VO and the ground terminal VS. The gates of the MOS transistors TN12 and TP12 are connected to an input terminal VI1, while the gates of the MOS transistors TN11 and TP11 are connected to an input terminal VI2.

In this embodiment, the MOS transistors TP11 and TP12 are constituted by a p-type semiconductor layer 70P formed on a sapphire substrate 72, and gate electrode layers 74 and 76 formed crosswise over the p-type semiconductor layer 70P through an insulating layer (not shown). The MOS transistor TN12 is constituted by an n-type semiconductrr layer 70N formed on the sapphire substrate 72 and in contact with the p-type semiconductor layer 70P, and the gate electrode layer 76 insulatively formed on the n-type semiconductor layer 70N. The MOS transistor TN11 is constituted by an n-type semiconductor layer 71N formed on the sapphire substrate 72 at a small distance from the n-type semiconductor layer 70N, and the gate electrode layer 74 insulatively formed on the n-type semiconductor layer 71N. The adjacent one ends of the layers 70P, 70N and 71N are commonly connected to an interconnection layer 78 for the output line. The other end of the layer 70P is connected to an interconnection layer 80 for the ground line. The other ends of the layers 70N and 70N are commonly connected to an interconnection layer 82 for the positive power source line. Insulating layers between the gate electrode layer 74 and the layer 70N and between the gate electrode layer 76 and the layer 71N are thick, and so the MOS transistors are not formed in the regions indicated by hatched lines in FIG. 16.

If these MOS transistors TN11, TN12, TP11 and TP12 are of E-type, the conduction states of the MOS transistors TN11, TN12, TP11 and TP12 and the level of the output signal appearing at the output terminal VO change as shown in Table III in accordance with changes in the levels of the input signals applied to the input terminals VI1 and VI2.

TABLE III

| VI1 | VI2 | TN11 | TN12 | TP11 | TP12 | VO |
|---|---|---|---|---|---|---|
| "0" | "0" | OFF | OFF | ON | ON | "0" |
| "1" | "0" | OFF | ON | ON | OFF | "1" |
| "0" | "1" | ON | OFF | OFF | ON | "1" |
| "1" | "1" | ON | ON | OFF | OFF | "1" |

Figure 17:
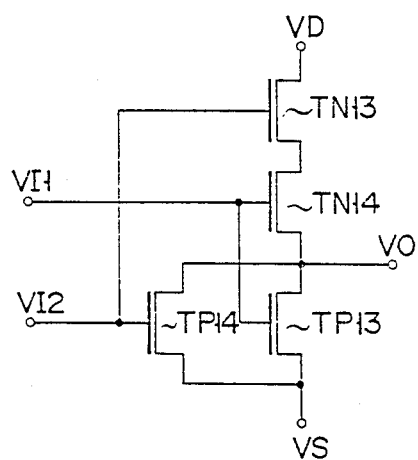
FIG. 17 is a circuit diagram of a CMOS AND gate circuit according to still another embodiment of the present invention.
Figure 18:
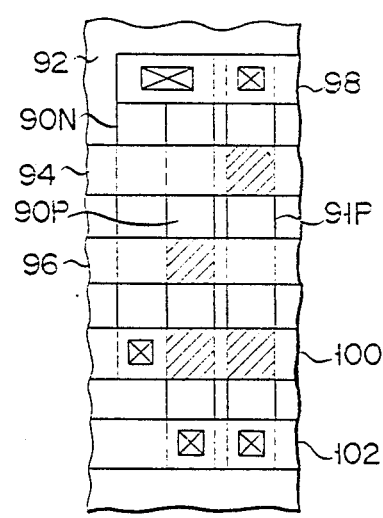
FIG. 18 is a schematic plan view of a semiconductor device constituting the CMOS AND gate circuit shown in FIG. 17.

FIG. 17 is a circuit diagram of a CMOS AND circuit according to still another embodiment of the present invention. FIG. 18 is a schematic plan view of an SOS semiconductor device constituting the CMOS AND circuit. This CMOS AND circuit includes n-channel MOS transistors TN13 and TN14 whose current paths are series-connected between the positive power source terminal VD and the output terminal VO, and p-channel MOS transistors TP13 and TP14 whose current paths are connected parallel to each other between the output terminal VO and the ground terminal VS. The gates of the MOS transistors TN14 and TP13 are commonly connected to the input terminal VI1, while the gates of the MOS transistors TN13 and TP14 are commonly connected to the input terminal VI2.

In this embodiment, the MOS transistors TN13 and TN14 are constituted by an n-type semiconductor layer 90N formed on a sapphire substrate 92, and gate electrode layers 94 and 96 formed crosswise over this n-type semiconductor layer 90N through an insulating layer (not shown). The MOS transistor TP13 is constituted by a p-type semiconductor layer 90P formed on the sapphire substrate 92 and in contact with the n-type semiconductor layer 90N, and the gate electrode layer 94 insulatively formed on the p-type layer 90P. The MOS transistor TP14 is constituted by a p-type semiconductor layer 91P formed on the sapphire substrate 92 and at a small distance from the p-type layer 90P, and the gate electrode layer 96 insulatively formed on the p-type semiconductor layer 91P. The adjacent one ends of the layers 90N, 90P and 91P are commonly connected to an interconnection layer 98 for the output line. The other end of the n-type semiconductor layer 90N is connected to an interconnection layer 100 for the positive power source line. The other ends of the p-type semiconductor layers 90P and 91P are connected to an interconnection layer 102 for the ground line. The insulating layers between the gate electrode layer 94 and the p-type semiconductor layer 91P and between the gate electrode layer 96 and the p-type semiconductor layer 90P are thick, so the MOS transistors are not formed in the regions indicated by the hatched lines shown in FIG. 18.

If the MOS transistors TN13, TN14, TP13 and TP14 are of E-type, the conduction states of these transistors and the level of the output signal from the output terminal VO change as shown in Table IV in accordance with changes in the levels of the input signals applied to the input terminals VI1 and VI2.

TABLE IV

| VI1 | VI2 | TN13 | TN14 | TP13 | TP14 | VO |
|---|---|---|---|---|---|---|
| "0" | "0" | OFF | OFF | ON | ON | "0" |
| "1" | "0" | OFF | ON | OFF | ON | "0" |
| "0" | "1" | ON | OFF | ON | OFF | "0" |
| "1" | "1" | ON | ON | OFF | OFF | "1" |

Since the n- and p-channel MOS transistors are respectively connected to the positive power source terminal and the ground terminal in the logic circuit shown in FIGS. 15 and 16, the n-type semiconductor layers 70N and 90N may be formed in contact with the p-type semiconductor layers 70P and 90P as shown in FIG. 18, so that a high integration may be achieved.

Figure 19:
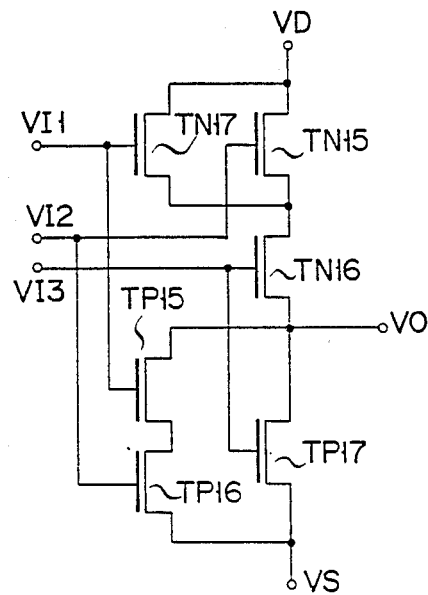
FIG. 19 shows a logic circuit according to still another embodiment of the present invention.
Figure 20:
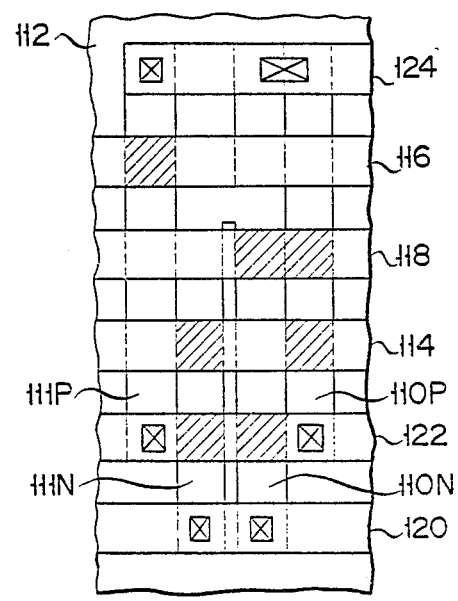
FIG. 20 is a schematic plan view of a semiconductor device constituting the logic circuit shown in FIG. 19.

FIG. 19 is a circuit diagram of a CMOS logic circuit according to still another embodiment of the present invention. FIG. 20 is a schematic plan view of an SOS semiconductor device constituting the CMOS logic circuit shown in FIG. 19. This CMOS logic circuit includes n-channel MOS transistors TN15 and TN16 whose current paths are series-connected between the positive power source terminal VD and the output terminal VO, an n-channel MOS transistor TN17 connected parallel to the MOS transistor TN15, p-channel MOS transistors TP15 and TP16 whose current paths are series-connected between the output terminal VO and the ground terminal VS, and a p-channel MOS transistor TP17 which is connected between the output terminal VO and the power source terminal VS. The gates of the MOS transistors TN17 and TP15 are connected to the input terminal VI1. The gates of the MOS transistors TN15 and TP16 are connected to the input terminal VI2. The gates of the MOS transistors TN16 and TP17 are connected to an input terminal VI3. The logic circuit shown in FIG. 19 has a gate circuit which, in turn, has an OR gate whose two input terminals are respectively connected to the input terminals VI1 and VI2, and an AND gate whose first input terminal is connected to the output terminal of the OR gate and whose second input terminal is connected to the input terminal VI3.

In this embodiment, the MOS transistors TN15 and TN16 are constituted by an n-type semiconductor layer 110N formed on a sapphire substrate 112, and respective gate electrode layers 114 and 116 formed crosswise over the n-type semiconductor layer 110N through an insulating layer (not shown). The MOS transistor TN17 is constituted by an n-type semiconductor layer 111N formed at a small distance from the n-type semiconductor layer 110N, and a gate electrode layer 118 formed crosswise over the n-type semiconductor layer 111N through an insulating layer. The MOS transistor TP17 is constituted by a p-type semiconductor layer 110P formed in contact with the n-type semiconductor layer 110N, and the gate electrode layer 116. The MOS transistors TP15 and TP16 are constituted by a p-type semiconductor layer 111P formed in contact with the n-type semiconductor layer 111N, and the respective gate electrode layers 118 and 119. The adjacent one ends of the n-type semiconductor layers 110N and 111N are connected to an interconnection layer 120 for the positive power source line. The adjacent one ends of the p-type semiconductor layers 110P and 111P are connected to an interconnection layer 122 for the ground line. The other ends of the n-type semiconductor layer 110N and the p-type semiconductor layers 110P and 111P are connected to an interconnection layer 124 for the output line. The other end of the n-type semiconductor layer 111N is connected to that portion of the n-type semiconductor layer 110N which lies between the gate electrode layers 114 and 116. Thus, the MOS transistors TN17 and TN15 are connected parallel to each other. The insulating layers between the gate electrode layer 114 and the p- and n-type semiconductor layers 110P and 111N, between the gate electrode layer 116 and the p-type semiconductor layer 111P, and between the gate electrode layer 118 and the p- and n-type semiconductor layers 110P and 110N are made thick, so the MOS transistors are not formed in the regions indicated by the hatched lines shown in FIG. 20.

If these MOS transistors TN15 to TN17 and TP15 to TP17 are of E-type, the conduction states of the transistors and the level of the output signal from the output terminal VO change as shown in Table V in accordance with changes in the levels of the input signals applied to the input signals VI1 to VI3.

TABLE V

| VI1 | VI2 | VI3 | TN15 | TN16 | TN17 | TP15 | TP16 | TP17 | VO |
|---|---|---|---|---|---|---|---|---|---|
| "0" | "0" | "0" | OFF | OFF | OFF | ON | ON | ON | "0" |
| "1" | "0" | "0" | OFF | OFF | ON | OFF | ON | ON | "0" |
| "0" | "1" | "0" | ON | OFF | OFF | ON | OFF | ON | "0" |
| "1" | "1" | "0" | ON | OFF | ON | OFF | OFF | ON | "0" |
| "0" | "0" | "1" | OFF | ON | OFF | ON | ON | OFF | "0" |
| "1" | "0" | "1" | OFF | ON | ON | OFF | ON | OFF | "1" |
| "0" | "1" | "1" | ON | ON | OFF | ON | OFF | OFF | "1" |
| "1" | "1" | "1" | ON | ON | ON | OFF | OFF | OFF | "1" |

As in the cases of the former embodiments, the n- and p-type semiconductor layers may be formed in contact with each other without adversely affecting the logic operation of the device in the logic circuit of this embodiment. A high integration may be achieved.

Figure 22:
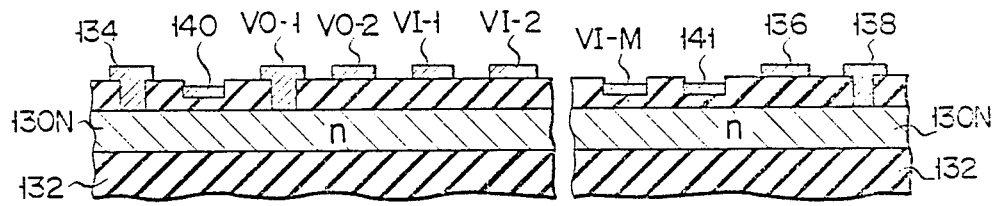
FIG. 22 is a sectional view of the semiconductor memory shown in FIG. 21 along the line A—A therein.
Figure 21:
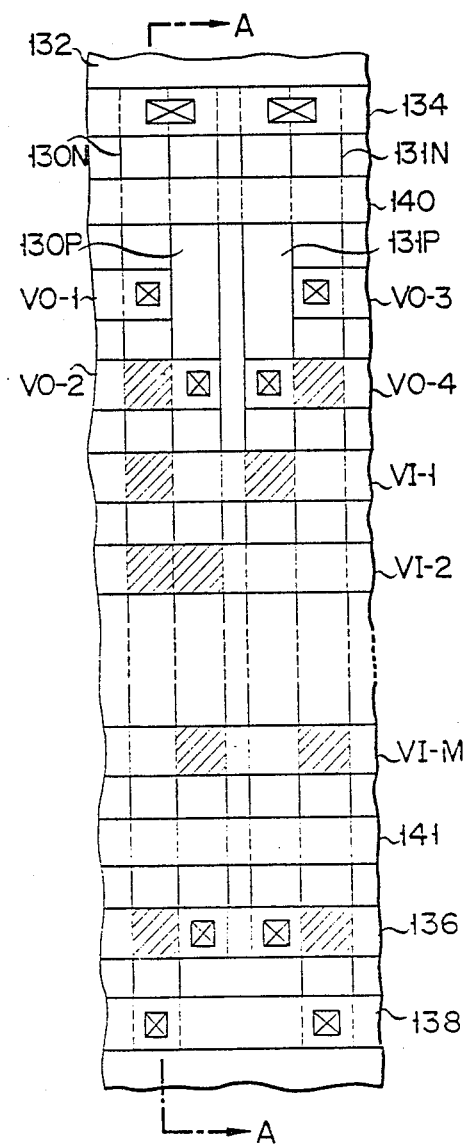
FIG. 21 is a schematic plan view of a semiconductor memory according to still another embodiment of the present invention.
Figure 23:
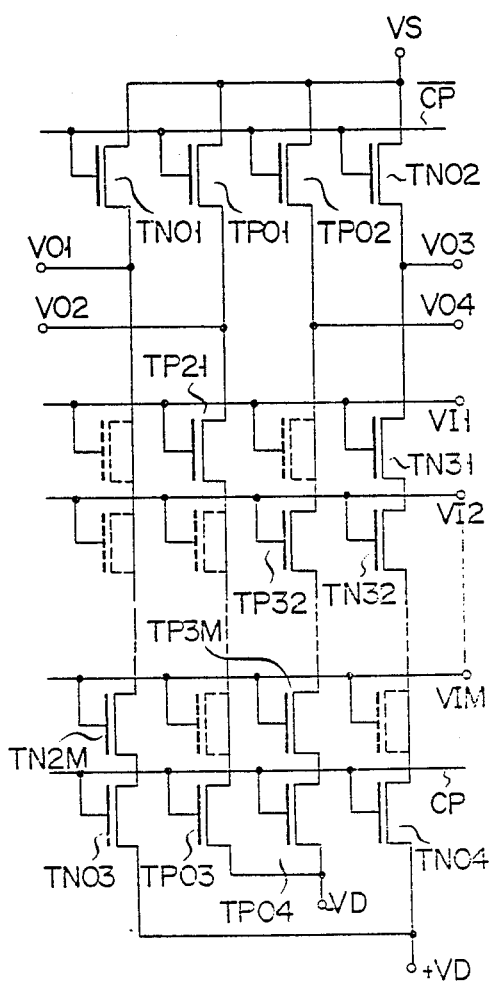
FIG. 23 is an equivalent circuit diagram of the semiconductor device shown in FIGS. 21 and 22.

FIG. 21 is a schematic plan view of part of a semiconductor memory according to still another embodiment of the present invention. FIG. 22 is a sectional view of this semiconductor memory, and FIG. 23 is an equivalent circuit diagram thereof. This semiconductor memory includes p-type semiconductor layers 130P and 131P formed with a small distance on a sapphire substrate 132, and n-type semiconductor layers 130N and 131N formed respectively in contact with the p-type semiconductor layers 130P and 131P. The adjacent one ends of these layers 130P, 131P, 130N and 131N are connected to an interconnection layer 134 for the ground line. The other ends of the p-type semiconductor layers 130P and 131P are connected to an interconnection layer 136 for the negative power source line. The other ends of the n-type semiconductor layers 130N and 131N are connected to an interconnection layer 138 for the positive power source line. Gate electrode layers VI-1 to VI-M are formed crosswise over the layers 130N, 131N, 130P and 131P through an insulating layer. Interconnection layers VO-1 to VO-4 for the output line are respectively connected to those portions of the layers 130N, 130P, 131N and 131P which lie between the interconnection layer 134 and the gate electrode layer VI-1 for the input line. In the vicinity of the interconnection layer 134, an interconnection layer 140 for transmitting a clock signal $\overline{CP}$ is formed crosswise over the layers 130N, 131N, 130P and 131P through the insulating layer. Between the interconnection layer 136 and the gate electrode layer VI—M, an interconnection layer 141 for transmitting a clock signal CP is formed crosswise over the layers 130N, 131N, 130P and 131P through the insulating layer.

In order to form a memory area storing desired memory data, the thickness of the insulating layer formed between the gate electrode layers VI-1 to VI-M and the layers 130N, 131N, 130P and 131P is changed according to the memory data to be stored. Thus, the MOS transistors are formed only at desired regions where the insulating layer is made thin. As shown in FIG. 22, for example, part of the insulating layer between the gate electrode layer VI-M and the n-type semiconductor layer 130N is made thin, and the MOS transistor (of D-type in this case) is formed at the corresponding area. The parts of the insulating layer between the gate electrode layers VI-1 and VI-2 and the n-type semiconductor layer 130N are made thick, and MOS transistors are not formed at the corresponding area. Referring to FIG. 21, MOS transistors are not formed at the areas regions indicated by the hatched lines.

In the semiconductor memory circuit shown in FIG. 23, the sources of n-channel MOS transistors TN01 and TN02 and p-channel MOS transistors TP01 and TP02 are commonly connected to the ground terminal VS. These MOS transistors TN01, TN02, TP01 and TP02 are constituted by an interconnection layer 140, and corresponding regions of the layers 130N, 131N, 130P and 131P. The drains of n-channel MOS transistors TN03 and TN04 are connected to a positive power source terminal +VD. The drains of p-channel MOS transistors TP03 and TP04 are connected to a negative power source terminal —VD. The MOS transistors TN03, TN04, TP03 and TP04 are constituted by an interconnection layer 141 and the corresponding regions of the layers 130N, 131N, 130P and 131P. Connected between the MOS transistors TN01 and TN03 are n-channel MOS transistors which are constituted by the gate electrode layers VI-1 to VI-M and the corresponding regions of the n-type semiconductor layer 130N. In FIG. 23, only a MOS transistor TN2M is shown whose gate is connected to an input terminal VIM. Similarly, n-channel MOS transistors connected between the MOS transistors TN02 and TN04 are constituted by the gate electrode layers VI-1 to VI-M and the corresponding regions of the n-type semiconductor layer 131N. In FIG. 23, only MOS transistors TN31 and TN32 are shown whose gates are respectively connected to the input terminals VI1 and VI2. Connected between the MOS transistors TP01 and TP03 are p-channel MOS transistors which are constituted by the gate electrode layers VI-1 to VI-M and the corresponding regions of the p-type semiconductor layer 130P. In FIG. 23, only a MOS transistor TP21 is shown whose gate is connected to the input terminal VI1. Similarly, p-channel MOS transistors connected between the MOS transistors TP02 and TP04 are constituted by the gate electrode layers VI-1 to VI-M and the corresponding regions of the p-type semiconductor layer 131P. In FIG. 23, only MOS transistors TP32 and TP3M are shown whose gates are respectively connected to the input terminals VI1 and VI2. The output terminals VO1 to V04 are respectively connected to the drains of the MOS transistors TN01, TP01, TN02 and TP02.

In this embodiment, series circuits of the n-channel MOS transistors are connected between the positive power source terminal +VD and the ground terminal VS, and series circuits of the p-channel MOS transistors are connected between the negative power source terminal −VD and the ground terminal VS. Therefore, the n- and p-type semiconductor layers used for forming these n- and p-channel MOS transistors can be formed in contact with each other. Since these n- and p-type semiconductor layers are substantially insulated from each other, the series circuit of the n-channel MOS transistors and the series circuit of the p-channel MOS transistors may not affect each other.

The mode of operation of the semiconductor memory circuit shown in FIG. 23 will now be described with reference to the signal waveforms shown in FIGS. 24A to 24G.

Figure 24A:
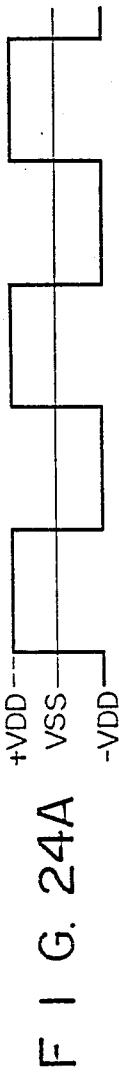
FIGS. 24A to 24G show signal waveforms for explaining the mode of operation of the semiconductor memory shown in FIGS. 21 to 23.

The high and low levels of the clock signal CP are respectively set at levels of the power source voltages +VDD and −VDD respectively applied to the positive and negative power source terminals +VD and −VD as shown in FIG. 24A. In order to operate the semiconductor memory formed of the n-channel MOS transistors, the input terminals VI1 to VIM are normally kept at +VDD level. In order to operate the semiconductor memory formed of the p-channel MOS transistors, the input terminals VI1 to VIM are normally kept at −VDD level. When the input terminals VI1 to VIM are kept at +VDD level, an output signal having two levels of +VDD and VSS and synchronous with the clock pulse CP is obtained from the output terminals VO1 and VO3, and at this time the output terminals V02 and V04 are kept at VSS level. On the other hand, if the input terminals VI1 to VIM are kept at −VDD level, an output signal having two levels of VSS and −VDD and synchronous with the clock pulse CP is obtained from the output terminals V02 and V04, while the output terminals VO1 and VO3 are kept at VSS level.

Figure 24B:
Figure 24C:
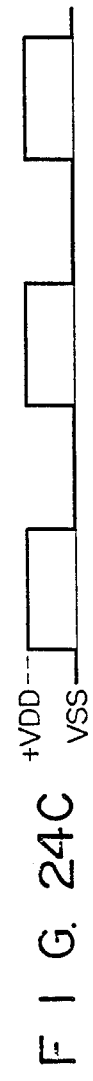
Figure 24D:
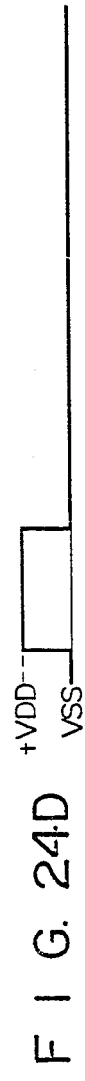

Assume now that the input signal to the input terminal VI2 alone is changed from +VDD level to −VDD level as shown in FIG. 24B in order to read out data from the semiconductor memory formed of n-channel MOS transistors. In this case, in the embodiment shown in FIG. 23, the conduction states of the MOS transistors TN32 and TP32 whose gates are connected to the input terminal VI2 are changed, while the conduction states of the MOS transistors whose gates are connected to the other input terminals are not changed. Thus, when the clock pulse CP is at a high level, the output terminal VO1 is electrically coupled to the positive power source terminal +VD since the MOS transistor TN03 is made conductive. When the clock pulse CP is at a low level, the output terminal VO1 is electrically coupled to the ground terminal VS through the MOS transistor TN01. Then, an output signal synchronous with the clock pulse CP is obtained from the output terminal VO1 as shown in FIG. 24C. Meanwhile, since the MOS transistor TN32 is nonconductive, the output terminal V03 is electrically isolated from the positive power source terminal +VD, so that the output signal from the output terminal V03 is set at a VSS level as shown in FIG. 24D. The MOS transistor TP32 is rendered conductive, but the MOS transistor TP3M is keep nonconductive. Therefore, the output terminal V04 is kept electrically isolated from the positive power source terminal +VD, and the output signal from this output terminal V04 is kept at a VSS level.

By detecting the levels of the output signals from the output terminals VO1 and V03 at a timing synchronous with the clock pulse CP, for example, data corresponding to the address input signal supplied to the input terminals VO1 to VOM is read out from the semiconductor memory formed of the n-channel MOS transistors.

Figure 24E:
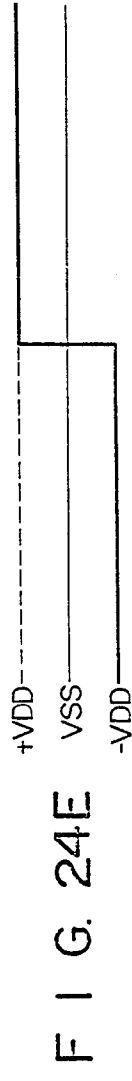
Figure 24F:
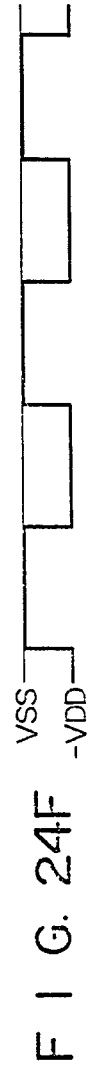
Figure 24G:
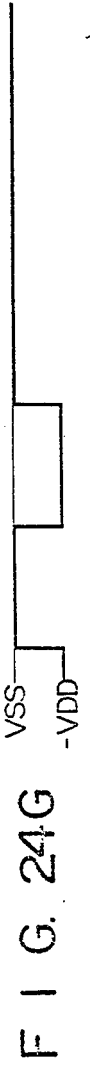

Assume now that the input signal applied to the input terminal VI2 alone is changed from −VDD level to +VDD level as shown in FIG. 24E, so as to read out data from the semiconductor memory formed of the p-channel MOS transistors. In this case, among the MOS transistors whose gates are connected to the input terminals VI1 to VIM, the MOS transistors TN32 and TP32 alone have their conduction states changed, and the conduction states of the other MOS transistors remain the same. Therefore, when the clock pulse CP is at a high level, the MOS transistor TP03 is rendered conductive, and the output terminal V02 is electrically coupled to the negative power source terminal −VD. On the other hand, when the clock pulse CP is at a low level, the output terminal V02 is electrically coupled to the ground terminal VS through the MOS transistor TP01. Therefore, the output signal synchronous with the clock signal CP is obtained from the output terminal V02 as shown in FIG. 24F. Since the MOS transistor TP32 is made nonconductive, the output terminal V04 is electrically isolated from the negative power source terminal −VD, and the output terminal V04 is kept at a VSS level as shown in FIG. 24G. In this case, the MOS transistor TN32 is conductive, but the MOS transistor TN31 is nonconductive. Therefore, the output terminal V03 is electrically isolated from the positive power source terminal +VD, and the output signal from the output terminal V03 is kept at a VSS level.

By detecting the levels of the output signals from the output terminals V02 and V04, data corresponding to the address input signal is read out from the semiconductor memory formed of the p-channel MOS transistors.

Figure 25:
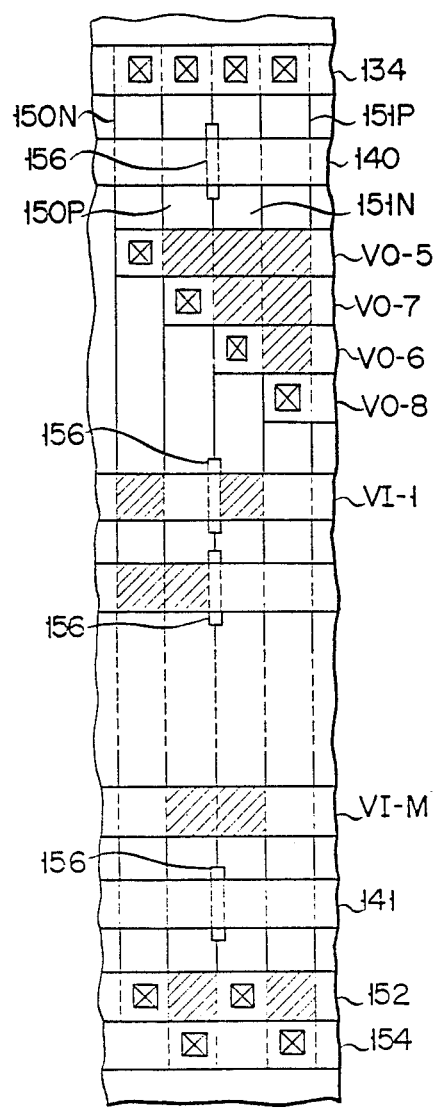
FIG. 25 is a schematic plan view showing a modification of the semiconductor memory shown in FIG. 21.

FIG. 25 shows a modification of the semiconductor device shown in FIG. 21. In the semiconductor device shown in FIG. 25, a p-type semiconductor layer 150P for forming p-channel MOS transistors is formed between and in contact with n-type semiconductor layers 150N and 151N for forming n-channel MOS transistors. Furthermore, a p-type semiconductor layer 151P for forming p-channel MOS transistors is formed in contact with the n-type semiconductor layer 151N. In this semiconductor device, interconnection layers VO-5 and VO-6 for the output line to be connected to the n-type semiconductor layers 150N and 151N, and an interconnection layer 152 for the positive power source line are formed of n-type polycrystalline silicon layers. On the other hand, interconnection layers VO-7 and VO-8 for the output line to be connected to the p-type semiconductor layers 150P and 151P, and an interconnection layer 154 for the negative power source line are formed of p-type polycrystalline silicon layers. The interconnection layers VO-5, VO-7, VO-6 and VO-8 are formed in contact with each other in this order, and the interconnection layers 152 and 154 are formed in contact with each other.

Where the layers 150P and 151N are formed in contact with each other, if the signal of high level is applied to the input line VI-1, the surface region of the layer 150P below the input line VI-1 forms an n-type inverted layer. Then, the layers 150N and 151N are electrically connected to each other through this inverted layer. In order to prevent the formation of such a leak path, gaps 156 are formed at appropriate portions of the pn junction between the layers 150P and 151N to locally separate the layers 150P and 151N.

Figure 1:
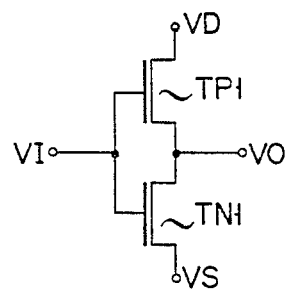
FIG. 1 is a circuit diagram of a conventional inverter circuit.
Figure 2:
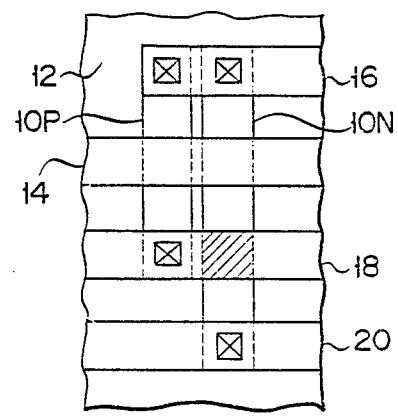
FIG. 2 is a schematic plan view of a semiconductor device constituting the inverter circuit shown in FIG. 1.
Figure 3:
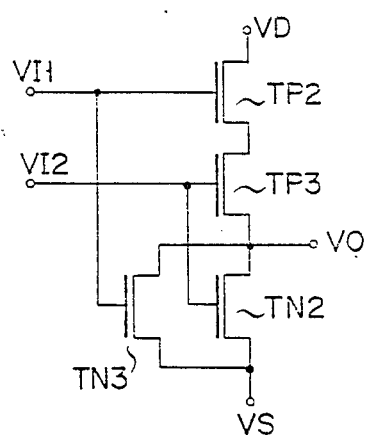
FIG. 3 shows a conventional NOR gate circuit.
Figure 4:
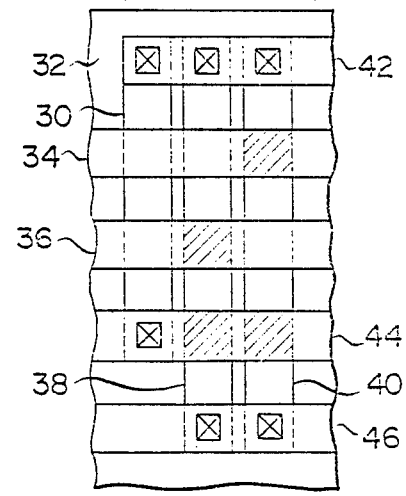
FIG. 4 is a schematic plan view of a semiconductor device constituting the NOR gate circuit shown in FIG. 3.

In this embodiment, a plurality of gaps 156 must be formed. However, in comparison with the embodiment shown in FIG. 1, the occupying area may be reduced and the intergration may be improved.

Figure 26:
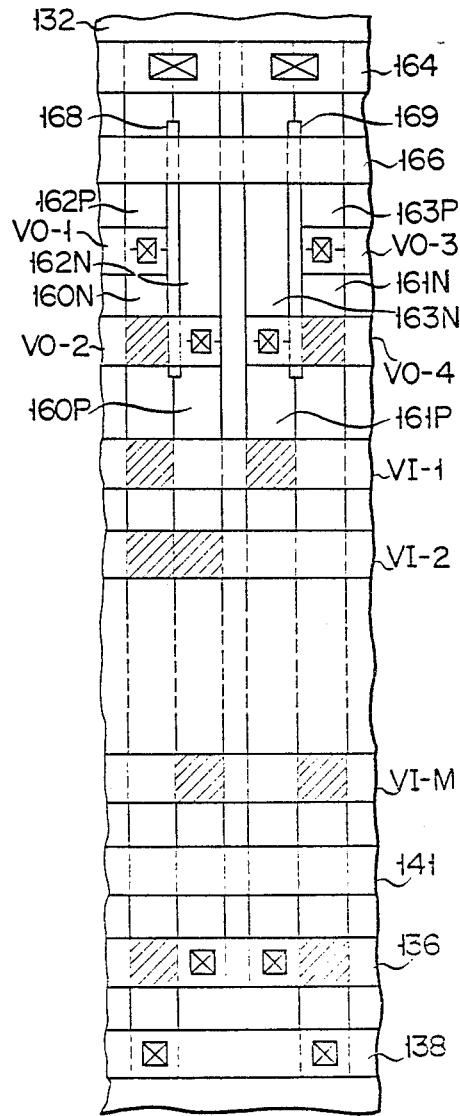
FIG. 26 is a schematic plan view showing another modification of the semiconductor memory shown in FIG. 21.

FIG. 26 shows a modification of the semiconductor device shown in FIG. 21. The semiconductor device includes n-type layers 160N and 161N and p-type layers 160P and 161P which are respectively formed in contact with the n-type layers 160N and 161N. The semiconductor device further includes p-type layers 162P and 163P which have one ends formed respectively in contact with the n-type layers 160N and 161N, and n-type layers 162N and 163N which have one ends formed respectively in contact with the p-type layers 160P and 161P. The other ends of the layers 162P, 163P, 162N and 163N are electrically connected to an interconnection layer 164 for the ground line. An interconnection layer 166 is formed crosswise on the layers 162P, 163P, 162N and 163N through a thin insulating layer (not shown). Gate electrode layers VI-1 to VI-M and interconnection layers 136, 138 and 141 are formed in the same manner as described with reference to FIG. 21. An interconnection layer VO-1 is formed electrically coupled with the contact portion of the n- and p-type layers 160N and 162P. Similarly, interconnection layers VO-2 to VO-4 are formed electrically coupled with the respective contact portions of p- and n-type layers 160P and 162N, of n- and p-type layers 161N and 163P and of p- and n-type layers 161P and 163N. Further, in the semiconductor device of FIG. 26, a gap 168 is formed to separate the n- and p-type layers 160N and 162P respectively from the n- and p-type layers 162N and 160P, and a gap 169 is formed to separate the p- and n-type layers 161P and 163N respectively from the p- and n-type layers 163P and 161N.

Figure 27:
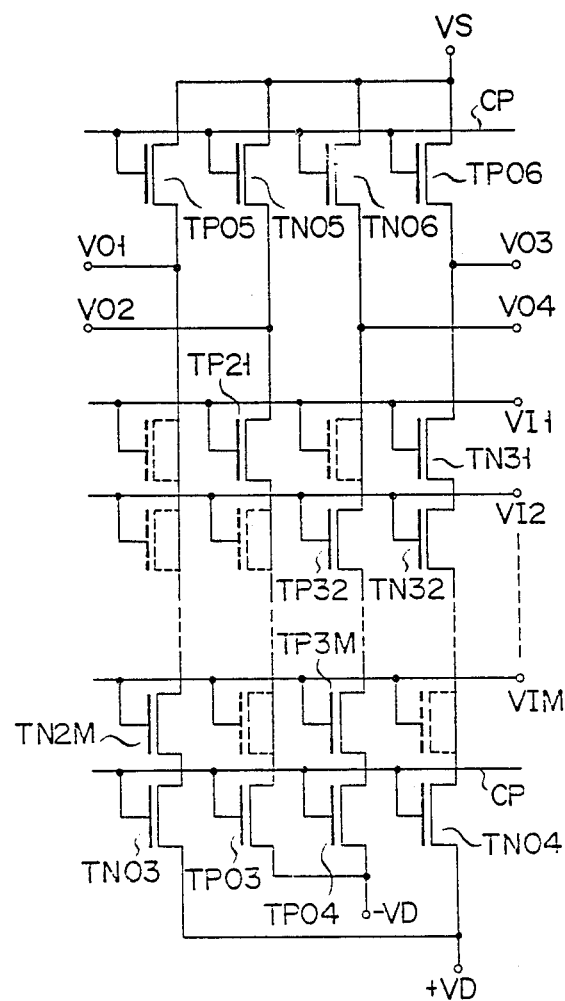
FIG. 27 is an equivalent circuit diagram of the semiconductor memory shown in FIG. 26.

FIG. 27 shows an equivalent circuit of the semiconductor device shown in FIG. 26. The circuit of FIG. 27 is similar to that shown in FIG. 23 except that p-channel MOS transistors TP05 and TP06 are connected in place of the n-channel MOS transistors TN01 and TN02, n-channel MOS transistors TN05 and TN06 are connected in place of the p-channel MOS transistors TP01 and TP02, and a clock pulse signal CP instead of a clock signal $\overline{CP}$ is applied to the gates of the MOS transistors TP05, TP06, TN05 and TN06. The MOS transistors TP05, TN05, TP06 and TN06 are constituted by the interconnection layer 166 and the respective semiconductor layer 162P, 162N, 163P and 163N.

Although the present invention has been described with reference to the particular embodiments thereof, the present invention is not limited to these embodiments. For example, in the embodiments shown in FIGS. 15 to 20, the MOS transistors for constituting the respective logic circuits are of E-type. However, these MOS transistors may be of D- or I-type as described with reference to FIGS. 7 or 13. Furthermore, in the embodiments described above, some CMOS circuits are described. However, it is also possible to form an n-channel MOS transistor circuit with various combination of series and parallel circuits of n-channel MOS transistors between the positive power source terminal VD and the output terminal VO or to form a p-channel MOS transistor circuit with various combination of series and parallel circuits of p-channel MOS transistors between the negative power source terminal VS and the output terminal VO.

In the embodiment shown in FIG. 21, the gate electrode layer 141 is formed between the gate electrode layer VI-M and the interconnection layer 136. However, it is possible to form this gate electrode layer 141 between the gate electrode layer VI-1 and the interconnection layer VO-2 or VO-4.

In the embodiments shown in FIGS. 21 to 23, the MOS transistors constituting the semiconductor memory are of D-type. However, they may be of E- or I-type MOS transistors. Furthermore, in the semiconductor memory shown in FIG. 25, the semiconductor layers 150P and 151N my be formed with a small distance therebetween instead of forming the gaps 156 therebetween. In the embodiments described above, the sapphire substrate is used as the insulating substrate. However, a substrate or layer formed of a material which is substantially insulative may be used instead. Further, the circuits of the embodiments shown in, for example, FIGS. 5, 15, 17 and 19 can also be formed using a semiconductor substrate instead of the insulating substrate such as sapphire substrate.

The terms "high" and "low" used herein with reference to the potential level are used in the mathematical sense. For example, it is to be understood that 0 V is higher than any negative voltage and is lower than any positive voltage.

What we claim is:

1. A semiconductor integrated circuit comprising:
   a first terminal set at a first potential;
   a second terminal set at a second potential more negative than said first potential;
   input and output means;
   an n-channel MOS transistor device circuit including at least one n-channel MOS transistor whose gate is connected to said input means and whose current path is connected between said first terminal and a circuit point which is coupled to said output means, said n-channel MOS circuit having a first n-channel MOS transistor whose current path is connected at one end of said circuit point, and a plurality of second n-channel MOS transistors whose current paths are connected in parallel between the other end of the current path said first n-channel MOS transistor and said first terminal; and
   a p-channel MOS circuit including at least one p-channel MOS transistor whose gate is connected to said input means and whose current path is connected between said circuit point and said second terminal, said p- and n-channel MOS transistors both being enhancement types, said p-channel MOS circuit having a first p-channel MOS transistor which is connected between said circuit point and said second terminal and a plurality of second p-channel MOS transistors whose current paths are series-connected between said circuit point and said second terminal;
   wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

2. A semiconductor integrated circuit according to claim 1, wherein said input means includes a plurality of input terminals, and a gate of said first n-channel MOS transistor is connected to a gate of said first p-channel MOS transistor and to one of said input terminals, and gates of said second n-channel MOS transistors are connected to respective gates of said second p-channel MOS transistors and to the remaining ones of said input terminals.

3. A semiconductor integrated circuit comprising:
a first terminal set at a first potential;
a second terminal set at a second potential more negative than said first potential;
input and output means;
an n-channel MOS transistor device circuit including at least one n-channel MOS transistor whose gate is connected to said input means and whose current path is connected between said first terminal and a circuit point which is coupled to said output means, said n-channel MOS circuit having a first switching n-channel MOS transistor whose current path is connected between said circuit point and said first output terminal, and a second switching n-channel MOS transistor and a plurality of n-channel MOS transistors whose current paths are series-connected between said first output terminal and said first terminal; and
a p-channel MOS circuit including at least one p-channel MOS transistor whose gate is connected to said input means and whose current path is connected between said circuit point and said second terminal, said p- and n-channel MOS transistors both being enhancement types, said p-channel MOS circuit having a first switching p-channel MOS transistor whose current path is connected between said circuit point and said second output terminal, a second switching p-channel MOS transistor and a plurality of p-channel MOS transistors whose current paths are series-connected between said second output terminal and said second terminal; and gatof said first and second switching n-channel MOS transistors are respectively connected to gates of said first and second switching p-channel MOS transistors;
wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

4. A semiconductor integrated circuit according to claim 3, wherein said first terminal, said second terminal and said circuit point are a positive power source terminal, a negative power source terminal and a ground terminal, respectively.

5. A semiconductor integrated circuit comprising:
a first terminal set at a first potential;
a second terminal set at a second potential more negative than said first potential;
input and output means;
an n-channel MOS circuit including at least one n-channel MOS transistor whose gate is connected to said input means and whose current path is connected between said first terminal and a circuit point which is coupled to said output means, said n-channel MOS circuit having a first n-channel MOS transistor whose current path is connected at one end to said circuit point, and a plurality of second n-channel MOS transistors whose current paths are connected in parallel between the other end of the current path of said first n-channel MOS transistor and said first terminal; and a p-channel MOS circuit including at least one p-channel MOS transistor whose gate is connected between said circuit point and said second terminal, said p- and n-channel MOS transistors both being depletion types; said p-channel MOS circuit having a first p-channel MOS transistor which is connected between said circuit point and said second terminal and a plurality of second p-channel MOS transistors whose current paths are series-connected between said circuit point and said second terminal;
wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

6. A semiconductor integrated circuit according to claim 5, wherein said input means includes plurality of input terminals, and a gate of said first n-channel MOS transistor is connected to a gate of said first p-channel MOS transistor and to one of said input terminals, and gates of said second n-channel MOS transistors are connected to respective gates of said second p-channel MOS transistors and to the remaining ones of said input terminals.

7. A semiconductor integrated circuit comprising:
a first terminal set at a first potential;
a second terminal set at a second potential more negative than said first potential;
input and output means; said output means including first and second output terminals,
an n-channel MOS circuit including at least one n-channel MOS transistor whose gate is connected to said input means and whose current path is connected between said first terminal and a circuit point which is coupled to said output means, said n-channel MOS circuit having a first switching n-channel MOS transistor whose current path is connected between said circuit point and said first output terminal, and a second switching n-channel MOS transistor and a plurality of n-channel MOS transistors whose current paths are series-connected between said first output terminal and said first terminal;
a p-channel MOS circuit including at least one p-channel MOS transistor whose gate is connected between said circuit point and said second terminal, said p- and n-channel MOS transistors both being depletion types; said p-channel MOS circuit having a first switching p-channel MOS transistor whose current path is connected between said circuit point and said second output terminal, a second switching p-channel MOS transistor, and a plurality of p-channel MOS transistors whose current paths are series-connected between said second output terminal and said second terminal; gates of said first and second switching n-channel MOS transistors being respectively connected to gates of said first and second switching p-channel MOS transistors;

wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

8. A semiconductor integrated circuit according to claim 7, wherein aid first terminal, said second terminal and said circuit point are a positive power source terminal, a negative power source terminal and a ground terminal, respectively.

9. A semiconductor integrated circuit comprising:
a first terminal set at a first potential;
a second terminal set at a second potential more negative than said first potential;
input and output means;
an n-channel MOS circuit including at least one n-channel MOS transistor whose gate is connected to said input means and whose current path is connected between said first terminal and a circuit point which is coupled to said output means, said n-channel MOS circuit having a first switching n-channel MOS transistor whose current path is connected between said circuit point, and a plurality of second n-channel MOS transistors whose current paths are connected in parallel between the other end of the current path of said first n-channel MOS transistor and said first terminal;
a p-channel MOS circuit including at least one p-channel MOS transistor whose gate is connected to said input means and whose current path is connected between said circuit point and said second terminal, said p-and n-channel MOS transistors having a zero threshold; said p-channel MOS circuit having a firsts p-channel MOS transistor which is connected between said circuit point and said second terminal and a plurality of second p-channel MOS transistors whose current paths are series-connected between said circuit point and said terminal;
wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

10. A semiconductor integrated circuit according to claim 9, wherein said input means includes a plurality of input terminals, and a gate of said first n-channel MOS transistor is connected to a gate of said first p-channel MOS transistor and to one of said input terminals, and gates of second n-channel MOS transistors are connected to respective gates of said second p-channel MOS transistors and to the remaining ones of said input terminals.

11. A semiconductor integrated circuit comprising:
a first terminal set at a first potential;
a second terminal set at a second potential more negative than said first potential;
input and output means, said output means including first and second output terminals;
an n-channel MOS circuit including at least one n-channel MOS transistor whose gate is connected to said input means and whose current path is connected between said first terminal and a circuit point which is coupled to said output means, said n-channel MOS circuit having a first switching n-channel MOS transistor whose current path is connected between said circuit point and said first output terminal, and a second switching n-channel MOS transistor and a plurality of n-channel MOS transistors whose current paths are series-connected between said first output terminal and said first terminal; and
a p-channel MOS circuit including at least one p-channel MOS transistor whose gate is connected to said input means and whose current path is connected between said circuit point and said second terminal, said p- and n-channel MOS transistors having a zero threshold; said p-channel MOS circuit having a first switching p-channel MOS transistor whose current path is connected between said circuit point and said second output terminal, a second switching p-channel MOS transistor and a plurality of p-channel MOS transistors whose current paths are series-connected between said second output terminal and said second terminal; gates of said first and second switching n-channel MOS transistors being respectively connected to gates of said first and second switching p-channel MOS transistors;
wherein the conduction state of said n-channel MOS transistor and said p-channel MOS transistor is controlled in response to an input signal supplied through said input means to set a potential at said circuit point in accordance with the conduction states of said n-channel MOS transistor and said p-channel MOS transistor.

12. A semiconductor integrated circuit according to claim 11, wherein said first terminal, said second terminal and said circuit point are a positive power source terminal, a negative power source terminal and a ground terminal, respectively.

13. A semiconductor circuit comprising:
a circuit point to be set at a predetermined potential,
first and second terminals to be respectively set at higher and lower potentials than the predetermined potential,
first and second output terminals,
a first switching p-channel MOS transistor whose current path is connected between said circuit point and first output terminal,
a first switching n-channel MOS transistor and a plurality of n-channel MOS transistors whose current paths are serially connected between said first terminal and first output terminal,
a second switching n-channel MOS transistor whose gate is connected to a gate of said first p-channel MOS transistor and whose current path is connected between said circuit point and second output terminal,
a second switching p-channel MOS transistor and a plurality of p-channel MOS transistors whose current paths are serially connected between said second terminal and second output terminal, said second switching p-channel MOS transistor having a gate connected to a gate of said first switching n-channel MOS transistor.

* * * * *

UNITED STATES PATENT AND TRADEMARK OFFICE
CERTIFICATE OF CORRECTION

PATENT NO. : 4,883,986
DATED : November 28, 1989
INVENTOR(S) : Hideharu EGAWA et al.

It is certified that error appears in the above-identified patent and that said Letters Patent is hereby corrected as shown below:

Claim 3, column 15, line 41, change "gatof" to --gates of --.

Claim 8, column 17, line 9, change "aid" to --said--.

Claim 9, column 17, line 23, "switching" should be deleted.

Claim 9, column 17, line 25, change "between" to --at one end to--.

Signed and Sealed this

Nineteenth Day of May, 1992

Attest:

DOUGLAS B. COMER

*Attesting Officer*   *Acting Commissioner of Patents and Trademarks*